(12) United States Patent
Tsuno (10) Patent No.: US 7,939,859 B2
(45) Date of Patent: May 10, 2011

(54) SOLID STATE IMAGING DEVICE AND METHOD FOR MANUFACTURING THE SAME

(75) Inventor: Morikazu Tsuno, Shiga (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 12/408,291

(22) Filed: Mar. 20, 2009

(65) Prior Publication Data

US 2009/0289282 A1 Nov. 26, 2009

(30) Foreign Application Priority Data

May 22, 2008 (JP) ................................ 2008-133884

(51) Int. Cl.
*H01L 27/48* (2006.01)
(52) U.S. Cl. ........... 257/219; 257/E21.317; 257/E27.15; 438/514; 438/57
(58) Field of Classification Search .................. 257/219, 257/E21.317, E27.15; 438/514, 57
See application file for complete search history.

(56) References Cited

U.S. PATENT DOCUMENTS

| 7,075,128 B2 | 7/2006 | Okada | |
|---|---|---|---|
| 2005/0040446 A1* | 2/2005 | Shinohara | 257/292 |
| 2008/0105905 A1* | 5/2008 | Kang et al. | 257/225 |

FOREIGN PATENT DOCUMENTS

| JP | 07-122733 | 5/1995 |
|---|---|---|
| JP | 2002-151599 | 5/2002 |

* cited by examiner

*Primary Examiner* — Hoai V Pham
*Assistant Examiner* — Elias Ullah
(74) *Attorney, Agent, or Firm* — McDermott Will & Emery LLP (57) ABSTRACT

A solid state imaging device includes a transfer transistor for transferring signal charges generated by photoelectric conversion to a floating diffusion layer, a reset transistor for resetting a potential of the floating diffusion layer, and an amplifying transistor for outputting a signal corresponding to the potential of the floating diffusion layer. A low concentration impurity region having an impurity concentration lower than that of the first conductivity type semiconductor region is formed in part of a surface portion of the first conductivity type semiconductor region which is located below a gate electrode of the amplifying transistor and serves as a well region of the amplifying transistor.

10 Claims, 7 Drawing Sheets

SOLID STATE IMAGING DEVICE AND METHOD FOR MANUFACTURING THE SAME

CROSS-REFERENCE TO RELATED APPLICATION

This non-provisional application claims priority under 35 U.S.C. §119(a) of Japanese Patent Application No. 2008-133884 filed in Japan on May 22, 2008, the entire contents of which are hereby incorporated by reference.

BACKGROUND OF THE INVENTION

The present disclosure relates generally to solid state imaging devices used in digital still cameras and the like and methods for manufacturing the same.

MOS (Metal Oxide Semiconductor) solid state imaging devices, including a MOS transistor for amplifying a signal detected by a photodiode in each pixel, have higher sensitivity as compared with CCD (Charge Coupled Device)-type solid state imaging devices.

Figure 8:
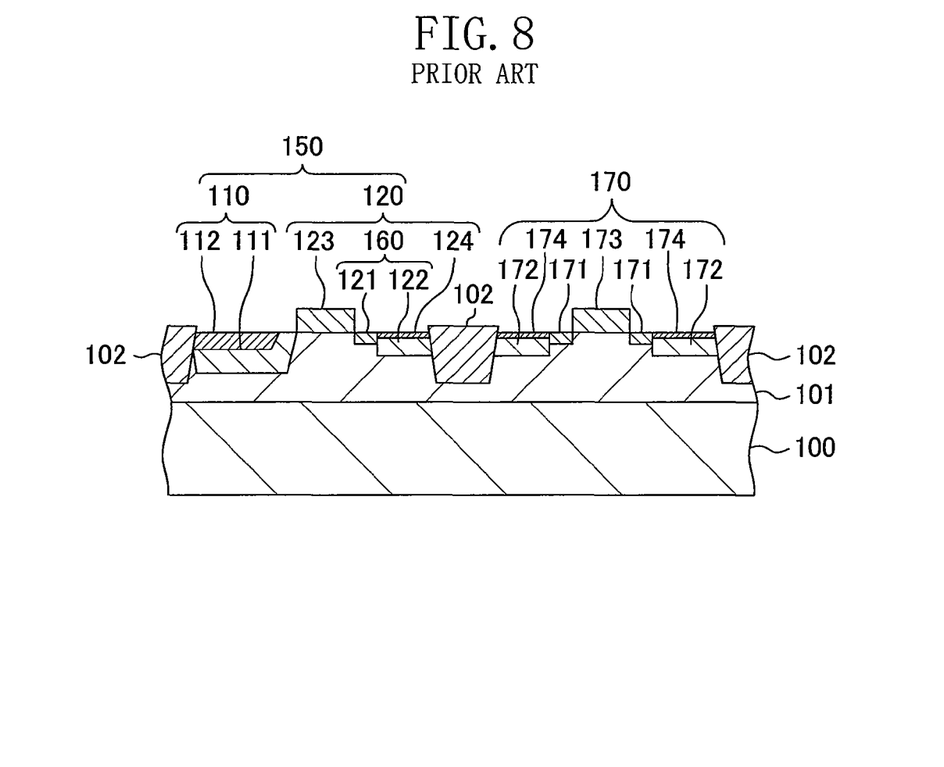
FIG. 8 is a sectional view schematically illustrating the structure of a unit pixel and an amplifying transistor of a conventional MOS solid state imaging device.

FIG. 8 is a sectional view schematically illustrating the structure of a unit pixel and an amplifying transistor of a conventional MOS solid state imaging device. In FIG. 8, a photodiode and a transfer transistor are shown as the unit pixel. The structure of the amplifying transfer shown in FIG. 8 is a typical structure of transistors (reset transistors, column selecting transistors, and other transistors: they are all N-type MOS transistors) formed on a semiconductor substrate other than the transfer transistors.

As shown in FIG. 8, a unit pixel 150 and an amplifier transistor 170 are formed in regions defined by isolation regions 102 in a surface portion of a semiconductor substrate 100 where a P-type well region 101(a P-well 101) is formed.

A photodiode 110 constituting the unit pixel 150 includes a P-type impurity region 112 and an N-type impurity region 111 formed in this order from the surface of the substrate. A transfer transistor 120 constituting the unit pixel 150 includes the N-type impurity region 111 of the photodiode 110 as a source region, a floating diffusion layer 160 as a drain region, and a gate electrode 123 formed on the P-well 101 between the N-type impurity region 111 and the floating diffusion layer 160. The floating diffusion layer 160 is formed of a low concentration impurity region 121 adjacent to the gate electrode 123 of the transfer transistor 120 and a high concentration impurity region 122 electrically connected to the low concentration impurity region 121.

The amplifying transistor 170 has a gate electrode 173 formed on the P-well 101, and low concentration impurity regions 171 adjacent to the gate electrode 173 and high concentration impurity regions 172 electrically connected to the low concentration impurity regions 171 as source/drain regions formed in a surface portion of the P-well 101 on both sides of the gate electrode 173.

In order to reduce parasitic resistance of contacts with the source/drain regions, metal silicide layers 124 and 174 are formed on the high concentration impurity region 122 of the floating diffusion layer 160 and the high concentration impurity diffusion regions 172 of the amplifying transistor 170, respectively.

In the conventional unit pixel 150 shown in FIG. 8, signal charges (electrons) generated by photoelectric conversion by the photodiode 110 and accumulated at a PN junction are transferred to the floating diffusion layer 160 when the transfer transistor 120 is brought into conduction. As the floating diffusion layer 160 is connected to the gate electrode 173 of the amplifying transistor 170, a potential of the floating diffusion layer 160 is read through the amplifying transistor 170 to output a pixel signal.

[Patent Document 1] Published Japanese Patent Application No. H7-122733

SUMMARY OF THE INVENTION

Figure 9:
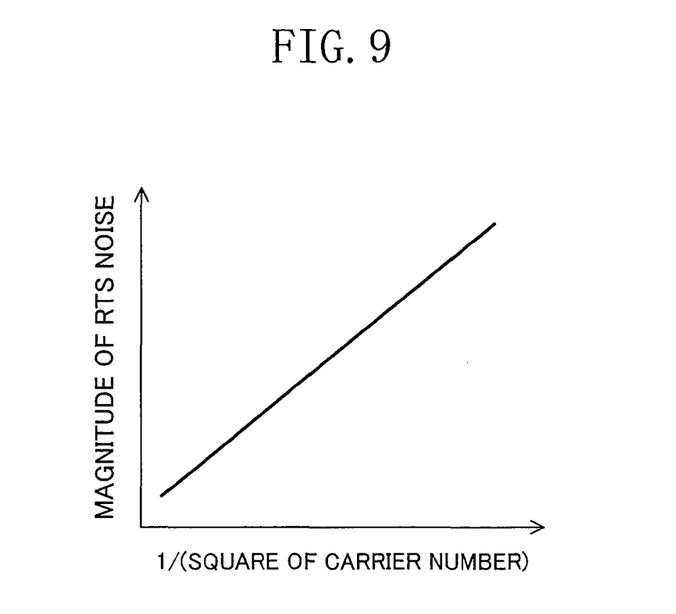
FIG. 9 is a graph illustrating the relationship between a reciprocal of a square of number of carriers N of the amplifying transistor and the magnitude of the RTS noise.

As the solid state imaging devices use more pixels, the size of pixel cells including the amplifying transistors is becoming smaller. However, in general, it has been known that RTS (Random Telegraph Signal) noise is proportional to $1/N^2$ when N is the number of carriers in the amplifying transistor. This relationship is illustrated in FIG. 9. The number of carriers N is defined by the equation (1):

$$N = W \times Lg \times Cox \times (Vg - Vth)/q \tag{1}$$

In the equation, W represents a gate width, Lg a gate length, Cox a capacity of a gate oxide film, Vg a gate voltage, Vth a threshold voltage, and q the amount of elementary charges. As expressed by the equation (1), when the size of the amplifying transistors is reduced due to the size reduction of the pixel cells, the number of carriers N decreases, and the RTS noise is likely to occur. As a result, an S/N characteristic of the circuit may deteriorate.

A possible cause of the pronounced occurrence of the RTS noise resulting from the decrease in number of carriers N may be the influence of a carrier capturing/releasing phenomenon caused by a carrier trap that exists at an interface with the gate oxide film. Specifically, the influence of the carrier capturing/releasing phenomenon, which has been averaged and less significant when the number of carriers N is large, becomes prominent as the number of carriers N decreases.

To cope with this, a method has been proposed as a measure against the RTS noise in the solid state imaging devices. According to this method, phosphorus is implanted by ion implantation to a channel region of the amplifying transistor at an implantation energy (an acceleration energy) of 300 keV to form an N-type layer in a region at a distance from the interface with the oxide film. Using a buried channel transistor structure obtained by the N-type layer, the influence of the carrier trap that exists at the interface with the oxide film is reduced (e.g., see Patent Document 1 and other like documents).

However, when the aforementioned buried channel layer is formed in the case where the gate width of the amplifying transistor isolated by an STI (shallow trench isolation) region is reduced as the pixel cells are reduced in size, a breakdown voltage in the isolation region is reduced and leakage is likely to occur because the depth at which the buried channel layer is formed is almost the same as or greater than the depth at which the STI region is formed.

Thus, as described above, a new technique that allows improving the RTS noise characteristic by increasing the number of carriers of the amplifying transistors has been demanded.

In view of the above-described disadvantages of the conventional technologies, the present disclosure has been proposed. The present disclosure proposes a solid state imaging device that allows improving the RTS noise characteristic even when the amplifying transistors isolated by the STI regions are reduced in size, and a method for manufacturing the same.

In order to achieve the aforementioned purpose, the present inventor has paid attention to a method of manufacturing a solid state imaging device including, on a semiconductor layer, a plurality of pixels for transferring signal charges generated by photoelectric conversion to a floating diffusion layer and outputting a signal corresponding to a potential of the floating diffusion layer through an amplifying transistor, and a transistor constituting a peripheral circuit. Based on this method, the present inventor has come up with the idea of forming an isolation region defining a photodiode formation region and a transistor formation region in a surface portion of the semiconductor layer, forming a first conductivity type well region in the photodiode formation region and the transistor formation region, and then implanting a second conductivity type impurity by ion implantation to reduce an impurity concentration in a top surface portion of the semiconductor layer serving as a channel region of the amplifying transistor.

According to the disclosed configuration, an impurity region having an impurity concentration lower than that in the well region is formed in the channel region immediately below a gate insulating film of the amplifying transistor. Therefore, a threshold voltage of the amplifying transistor can effectively be reduced, and the number of carriers is increased. As a result, the influence of a carrier trap that exists at the interface with the gate insulating film can be reduced, and the RTS noise characteristic can be improved. Further, since the number of carriers can be increased without forming a buried channel layer, leakage resulting from the reduction in breakdown voltage in the isolation region is less likely to occur, and the RTS noise characteristic can be improved even when the amplifying transistor is isolated by an STI region for the size reduction. In the present disclosure, the ion implantation of the second conductivity type impurity for forming a low concentration impurity region serving as a channel region is performed under the conditions that do not bring about reduction in carrier mobility in the amplifying transistor.

More specifically, the disclosed solid state imaging device includes a transfer transistor for transferring signal charges generated by photoelectric conversion to a floating diffusion layer, a reset transistor for resetting a potential of the floating diffusion layer, and an amplifying transistor for outputting a signal corresponding to the potential of the floating diffusion layer. The solid state imaging device further includes: a first conductivity type semiconductor region serving as a well region of the amplifying transistor; and a low concentration impurity region which is formed in part of a surface portion of the first conductivity type semiconductor region below a gate electrode of the amplifying transistor, and has an impurity concentration lower than that of the first conductivity type semiconductor region.

Regarding the disclosed solid state imaging device, the low concentration impurity region may substantially be an intrinsic semiconductor region.

In order to obtain the aforementioned advantages of the present disclosure with reliability in the disclosed solid state imaging device, the low concentration impurity region preferably has an impurity concentration of $3 \times 10^{16}$ cm$^3$ or lower, or an impurity concentration of ½ or lower of the impurity concentration of the first conductivity type semiconductor region. Further, the low concentration impurity region is preferably formed in a region ranging from an interface with a gate insulating film of the amplifying transistor to a depth of 60 nm.

Regarding the disclosed solid state imaging device, an STI region may be formed in part of the first conductivity type semiconductor region between the transfer transistor and the amplifying transistor.

The disclosed method is a method for manufacturing a solid state imaging device including a transfer transistor for transferring signal charges generated by photoelectric conversion to a floating diffusion layer, a reset transistor for resetting a potential of the floating diffusion layer, and an amplifying transistor for outputting a signal corresponding to the potential of the floating diffusion layer, the method including: (a) forming a first conductivity type semiconductor region serving as a well region of the amplifying transistor on a substrate; and (b) implanting a second conductivity type impurity to a surface portion of the first conductivity type semiconductor region to form a low concentration impurity region having an impurity concentration lower than that of the first conductivity type semiconductor region and serving as a channel region of the amplifying transistor.

Regarding the disclosed method for manufacturing the solid state imaging device, the implantation (b) may be performed before the formation (a). Specifically, the low concentration impurity region serving as the channel region of the amplifying transistor may be formed first, and then the first conductivity type semiconductor region serving as the well region of the amplifying transistor may be formed.

Regarding the disclosed method for manufacturing the solid state imaging device, the low concentration impurity region may substantially be an intrinsic semiconductor region.

Regarding the disclosed method for manufacturing the solid state imaging device, the second conductivity type impurity is arsenic or phosphorus.

According to the present disclosure described above, even when the gate width of the amplifying transistor isolated by the STI region is reduced as the size of the pixel cells is reduced, the number of carriers of the amplifying transistor can be increased, and the occurrence of the RTS noise can be suppressed. As a result, the S/N characteristic of the circuit can be improved. This allows manufacture of high sensitive solid state imaging devices with high yield.

Thus, the present disclosure advantageously makes it possible to manufacture the high sensitive solid state imaging devices with stability, and is useful for solid state imaging devices and methods for manufacturing the same.

DETAILED DESCRIPTION OF THE INVENTION

Embodiment

Hereinafter, an example solid state imaging device and an example method for manufacturing the same according to the present disclosure will be explained with reference to the drawings.

Figure 1A:
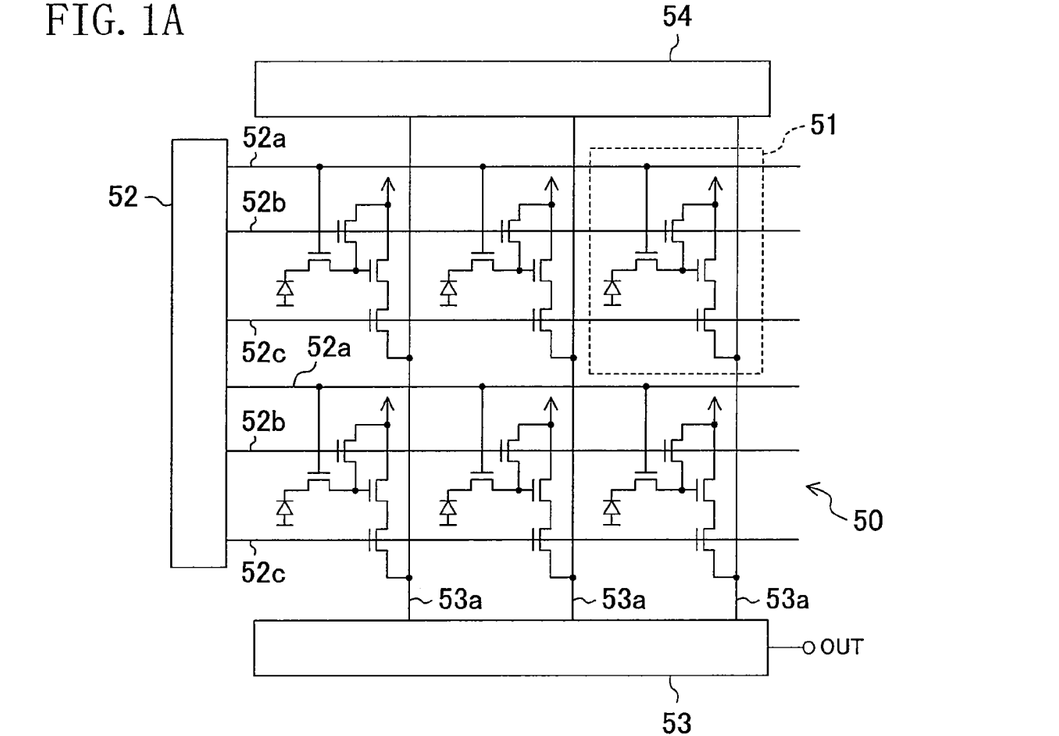
FIG. 1A is a circuit diagram schematically illustrating the structure of a first example solid state imaging device.
Figure 1B:
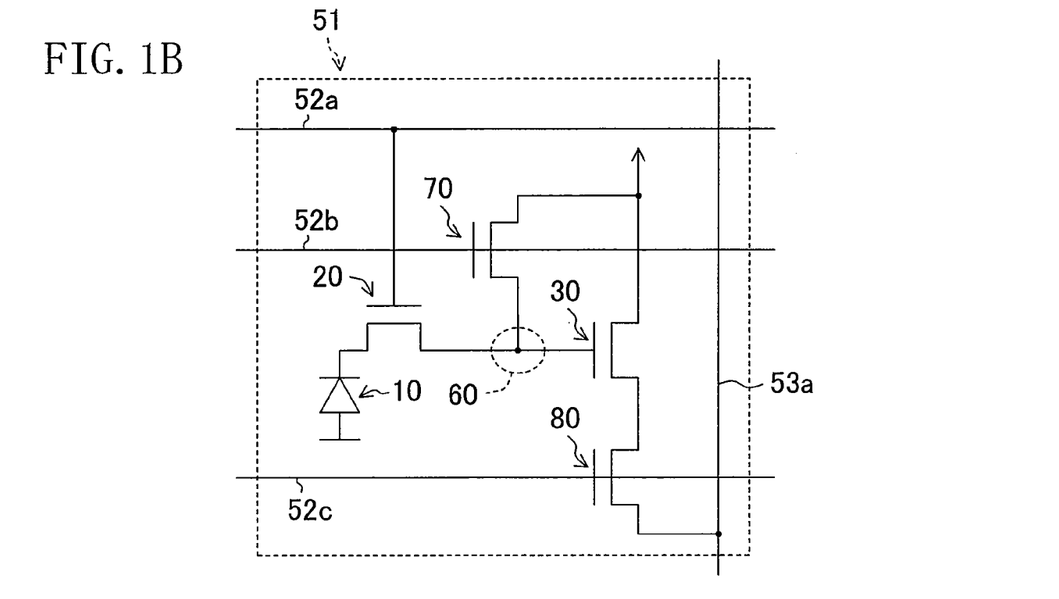
FIG. 1B is a circuit diagram illustrating an enlargement of one of unit pixels shown in FIG. 1A.

FIG. 1A is a circuit diagram schematically illustrating the structure of a first example solid state imaging device, more specifically, a MOS solid state imaging device. FIG. 1B is a circuit diagram illustrating an enlargement of one of unit pixels shown in FIG. 1A. As shown in FIG. 1A, a light sensitive region 50 of the example MOS solid state imaging device includes a plurality of unit pixels 51 arranged in a two-dimensional array. A peripheral circuit including, for example, a vertical shift register 52 for selecting the pixels in a column direction, a horizontal shift register 53 for selecting the pixels in a line direction, and a pulse generator circuit 54 for supplying a timing pulse to the vertical shift register 52 and the horizontal shift register 53, is formed around the light sensitive region 50. As shown in FIG. 1B, the unit pixel 51 includes a photodiode 10, a transfer transistor 20, an amplifying transistor 30, a reset transistor 70, and a column selecting transistor 80. More specifically, the transfer transistor 20 includes an impurity region of the photodiode 10 as a source region, a floating diffusion layer 60 as a drain region, and a gate electrode connected to a signal line 52a for selection in the column direction extending from the vertical shift register 52. The floating diffusion layer 60 is connected to a gate electrode of the amplifying transistor 30 and a source region of the reset transistor 70. A gate electrode of the reset transistor 70 is connected to a reset signal line 52b extending from the vertical shift register 52. A drain region of the amplifying transistor 30 and a drain region of the reset transistor 70 are common and they are connected to a power supply line (not shown). A source region of the amplifying transistor 30 and a drain region of the column selecting transistor 80 are common. A source region of the column selecting transistor 80 is connected to a signal line 53a for selection in the line direction extending from the horizontal shift register 53, and a gate electrode of the column selecting transistor 80 is connected to a control signal line 52c extending from the vertical shift register 52.

When the example MOS solid state imaging device is configured into a CMOS (Complementary-MOS) image sensor, the peripheral circuit is configured by a CMOS logic circuit obtained by combining an N-type MOS transistor and a P-type MOS transistor. The transfer transistor 20, the amplifying transistor 30, the reset transistor 70, and the column selecting transistor 80 constituting the unit cell 51 are all N-type MOS transistors.

When the example MOS solid state imaging device is configured into a MOS solid state imaging device including the peripheral circuit configured by N-type MOS transistors only, the MOS solid state imaging device can be configured by the N-type MOS transistors only. In this case, the production processes can be simplified.

Figure 2:
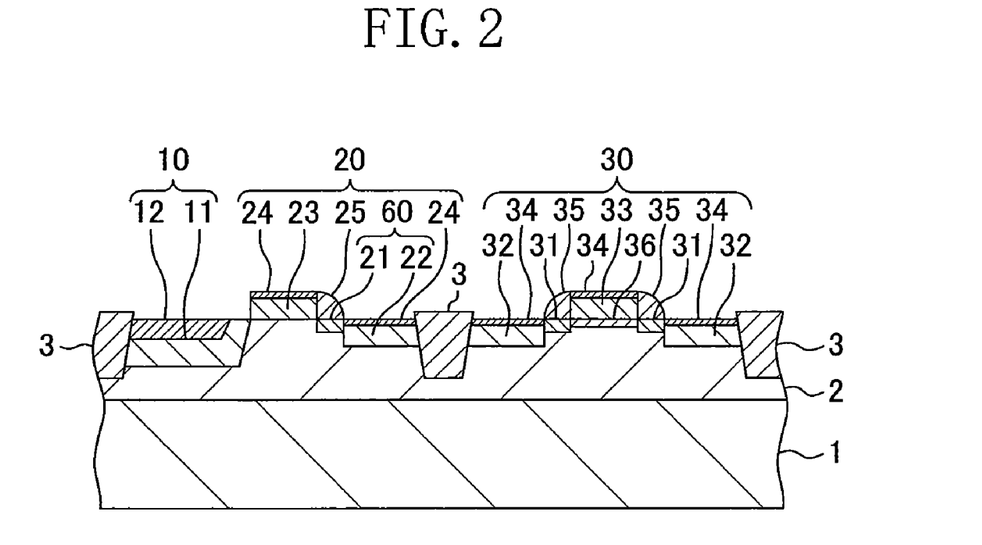
FIG. 2 is a sectional view schematically illustrating the structure of the unit pixel (a photodiode, a transfer transistor and an amplifying transistor) of the first example solid state imaging device.

FIG. 2 is a sectional view schematically illustrating the structure of the unit pixel (the photodiode, the transfer transistor, and the amplifying transistor) of the example MOS solid state imaging device. In FIG. 2, the same components as those shown in FIGS. 1A and 1B are indicated by the same reference numerals. The structure of the amplifying transistor shown in FIG. 2 is a typical structure of transistors formed on a semiconductor substrate other than the transfer transistors (reset transistors, column selecting transistors, and other transistors: they are all N-type MOS transistors). In the MOS solid state imaging device shown in FIG. 2, the photodiode 10, the transfer transistor 20, and the amplifying transistor 30 are arranged in this order from left to right. However, as described later, an N-type impurity region of the photodiode 10 is common with a source region of the transfer transistor 20. Therefore, in FIG. 2, the gate electrode and the drain region (the floating diffusion layer 60) of the transfer transistor 20 are indicated as the transfer transistor 20.

As shown in FIG. 2, the photodiode 10, the transfer transistor 20, and the amplifying transistor 30 are formed in regions defined by isolation (STI) regions 3 in a surface portion of a semiconductor substrate 1 where a P-type well region 2 (a P-well 2) is formed.

The photodiode 10 includes a P-type impurity region 12 and an N-type impurity region 11 formed in this order from the surface of the substrate. The transfer transistor 20 includes the N-type impurity region 11 of the photodiode 10 as a source region, the floating diffusion layer 60 as a drain region, and a gate electrode 23 formed on the P-well 2 between the N-type impurity region 11 and the floating diffusion layer 60. A gate insulating film below the gate electrode 23 is omitted from the figure. The floating diffusion layer 60 includes a low concentration impurity region 21 adjacent to the gate electrode 23 of the transfer transistor 20, and a high concentration impurity region 22 electrically connected to the low concentration impurity region 21. Metal silicide layers 24 are formed in surface portions of the high concentration impurity region 22 of the floating diffusion layer 60 and the gate electrode 23, respectively. An insulating sidewall spacer 25 is formed on one of the side surfaces of the gate electrode 23 closer to the floating diffusion layer 60. The low concentration impurity region 21 is formed below the insulating sidewall spacer 25.

The amplifying transistor 30 has a gate electrode 33 formed on the P-well 2, and low concentration impurity regions 31 adjacent to the gate electrode 33 and high concentration impurity regions 32 electrically connected to the low concentration impurity regions 31 as source/drain regions formed in the surface portion of the P-well 2 on both sides of the gate electrode 33. A gate insulating film below the gate electrode 33 is omitted from the figure. Metal silicide layers 34 are formed in surface portions of the high concentration impurity region 32 and the gate electrode 33, respectively. Insulating sidewall spacers 35 are formed on both side surfaces of the gate electrode 33. The low concentration impurity regions 31 are formed below the insulating sidewall spacers 35.

As a feature of the present embodiment, a low concentration impurity region 36 is formed in part of the surface portion of the P-well 2 (a channel region) below the gate electrode 33 of the amplifying transistor 30. The impurity concentration in the low concentration impurity region 36 (e.g., about $3 \times 10^{16}$ $cm^3$ or lower) is lower than that in the P-well 2 (e.g., about $2 \times 10^{17}$ $cm^3$). Therefore, a threshold voltage of the amplifying transistor 30 can effectively be reduced, and the number of carriers can be increased. As a result, the influence of a carrier trap that exists at the interface with the gate insulating film can be reduced, and the RTS noise characteristic can be improved. Since the number of carriers can be increased without forming a buried channel layer, leakage resulting from the reduction in breakdown voltage in the isolation region is less likely to occur, and the RTS noise characteristic can be improved even when the amplifying transistor 30 is isolated by an STI region 3 for the size reduction.

According to the present embodiment described above, the number of carriers of the amplifying transistor 30 can be increased, and the occurrence of the RTS noise can be suppressed even when the gate width of the amplifying transistor 30 isolated by the STI region 3 is reduced due to the size reduction of the pixel cells. As a result, the S/N characteristic of the circuit can be improved. This allows manufacture of high sensitive solid state imaging devices with high yield.

Hereinafter, an example method for manufacturing the example MOS solid state imaging device will be explained. FIGS. 3A-3D, 4A-4C and 5A-5C are sectional views illustrating the processes of the example method for manufacturing the example MOS solid state imaging device. In FIGS. 3A-3D, 4A-4C and 5A-5C, the same components as those shown in FIGS. 1A, 1B and 2 are indicated by the same reference numerals.

Figure 3A:
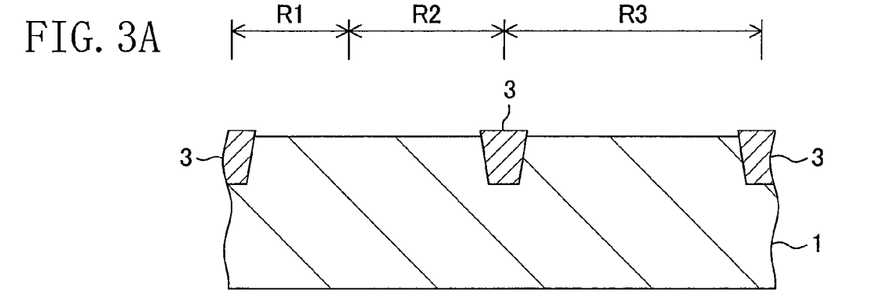
FIGS. 3A-3D are sectional views illustrating the processes of a method for manufacturing the first example solid state imaging device.

First, as shown in FIG. 3A, isolation regions 3 are formed in a surface portion of a semiconductor substrate 1 made of N-type silicon, for example, by a known method. The isolation region 3 may have an STI structure formed to a depth of about 300 nm, for example (hereinafter, the isolation region 3 is referred to as an STI region 3).

Figure 3B:
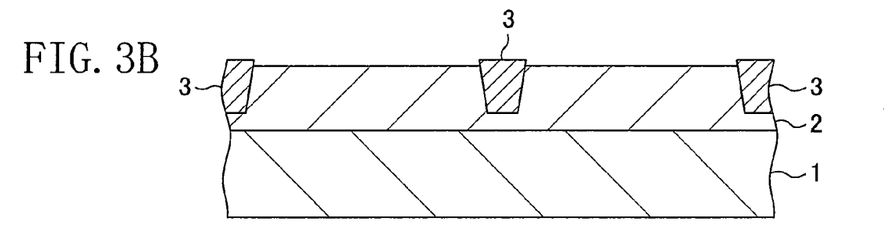

Then, P-type impurities, e.g., boron, are implanted by ion implantation into element formation regions of the semiconductor substrate 1 to form a P-well 2 as shown in FIG. 3B. The P-well 2 has an impurity concentration of about $2\times10^{17}$ cm$^3$, for example.

Figure 3C:
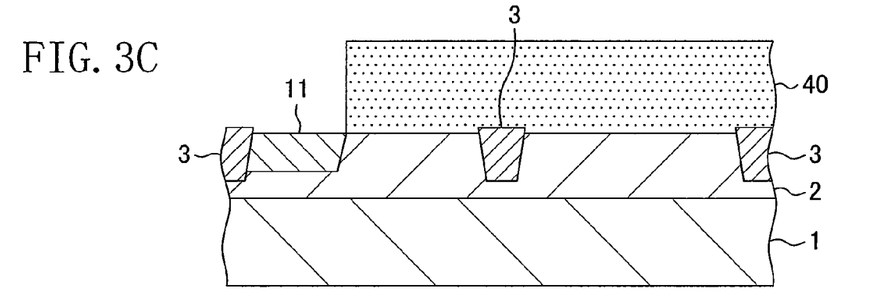

Using a resist pattern 40 having an opening corresponding to a photodiode formation region R1 only as a mask, N-type impurities are implanted into the surface portion of the semiconductor substrate 1 by ion implantation to form an N-type impurity region 11 constituting the photodiode 10 as shown in FIG. 3C.

Figure 3D:
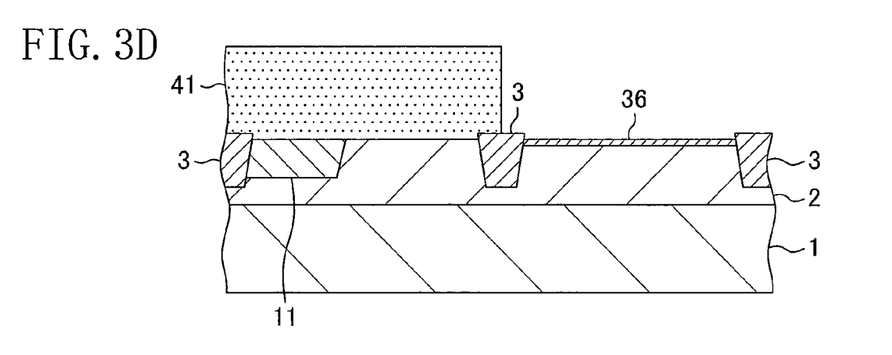

Then, using a resist pattern 41 having an opening corresponding to an amplifying transistor formation region R3 only as a mask, N-type impurities are implanted into the surface portion of the semiconductor substrate 1 (a portion serving as a channel region of the amplifying transistor 30) to form a low concentration impurity region 36 as shown in FIG. 3D. In this process, arsenic (As) is implanted at an implantation energy of 60 keV and a dose amount of $4.1\times10^{12}$/cm$^2$ by ion implantation. Under these conditions, the low concentration impurity region 36 does not show the N-type conductivity type. The low concentration impurity region 36 having an effective impurity concentration of $3\times10^{16}$ cm$^3$ or lower is formed in a region ranging from the substrate surface to a depth of about 60 nm.

Figure 4A:
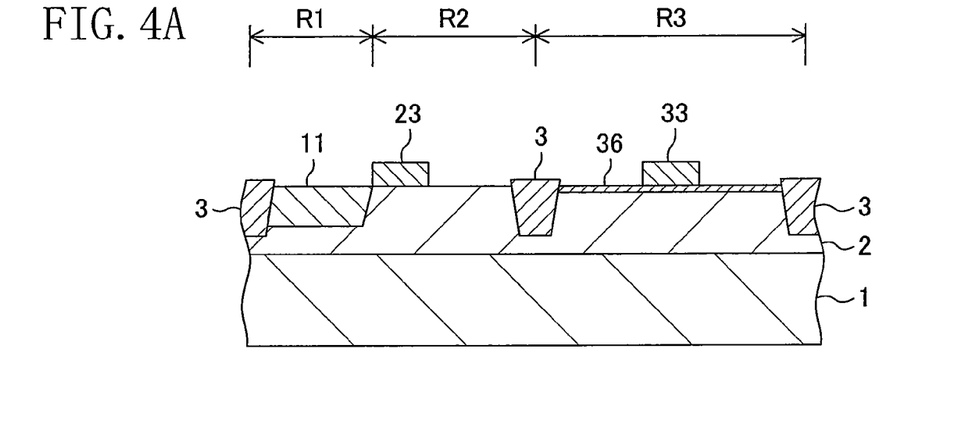
FIGS. 4A-4C are sectional views illustrating the processes of the method for manufacturing the first example solid state imaging device.

Then, a gate insulating film (not shown) made of a silicon oxide film of about 5-10 nm in thickness is formed on the surface of the semiconductor substrate 1, for example, by thermal oxidation. A conductive polysilicon film of about 180-200 nm in thickness is formed on the gate insulating film, for example, by reduced-pressure CVD (Chemical Vapor Deposition) or other like technique. Then, the polysilicon film is etched by known photolithography and etching to form a gate electrode 23 of the transfer transistor 20 and a gate electrode 33 of the amplifying transistor 30 on the semiconductor substrate 1 as shown in FIG. 4A.

Figure 4B:
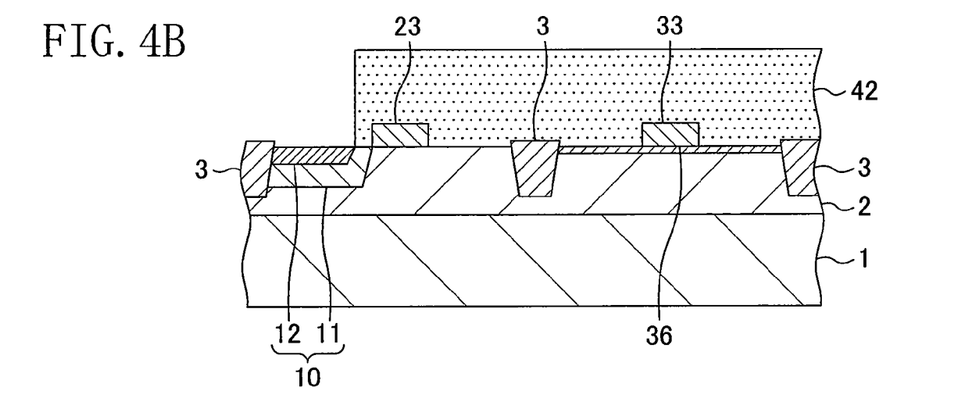

Then, as shown in FIG. 4B, a resist pattern 42 having an opening ranging from a position at a certain distance from a source-side edge of the gate electrode 23 of the transfer transistor 20 to the STI region 3 defining an edge of the photodiode formation region R1 (the source region of the transfer transistor 20) is formed by known photolithography. Using the resist pattern 42 as a mask, P-type impurities are implanted into an upper portion of the N-type impurity region 11 by ion implantation to form a P-type impurity region 12 constituting the photodiode 10.

Figure 4C:
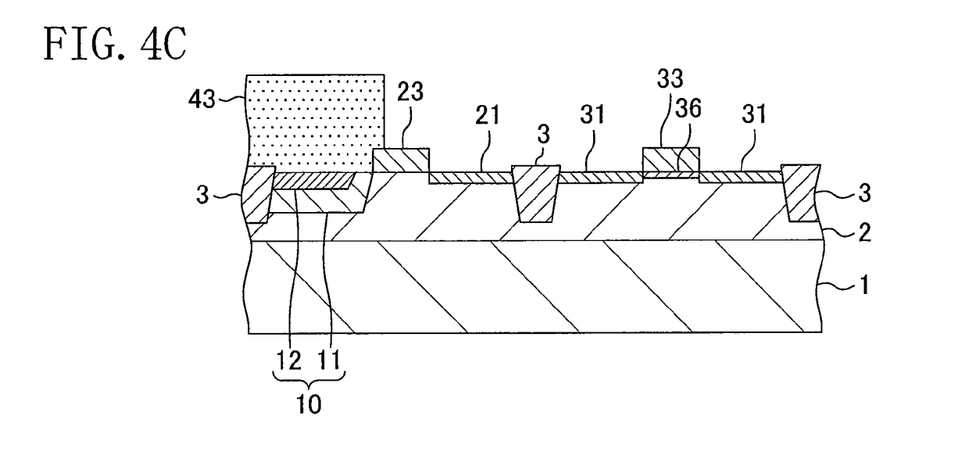

As shown in FIG. 4C, using a resist pattern 43 having an opening corresponding to the transfer transistor formation region R2 and the amplifying transistor formation region R3, the gate electrode 23 of the transfer transistor 20, and the gate electrode 33 of the amplifying transistor 30 as a mask, N-type impurities are implanted by ion implantation into the surface portion of the semiconductor substrate 1 to form an N-type low concentration impurity region 21 constituting part of the drain region of the transfer transistor 20, and N-type low concentration impurity regions 31 constituting parts of the source and drain regions of the amplifying transistor 30. In this process, phosphorus (P) is implanted by ion implantation at an implantation energy of 45 keV and a dose amount of $2\times10^{13}$/cm$^2$ and arsenic (As) is implanted by ion implantation at an implantation energy of 45 keV and a dose amount of $1.2\times10^{13}$/cm$^2$. As a result, low concentration impurity regions 21 and 31 having a junction depth of about 60 nm and a maximum impurity concentration of about $1.0\times10^{18}$/cm$^3$ are formed.

Figure 5A:
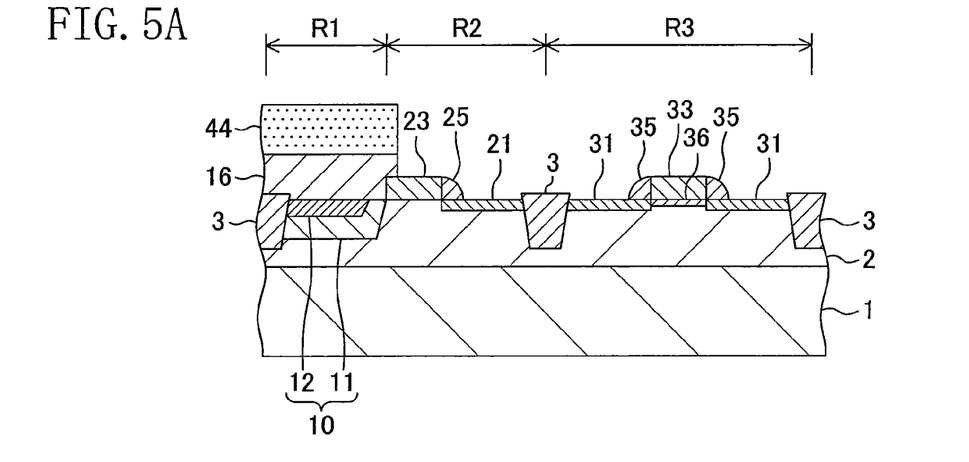
FIGS. 5A-5C are sectional views illustrating the processes of the method for manufacturing the first example solid state imaging device.

Then, an insulating film 16 made of, for example, a silicon oxide film or a silicon nitride film, is deposited on the whole surface of the semiconductor substrate 1 by, for example, CVD, and a resist pattern 44 covering the photodiode formation region R1 is formed by photolithography or other like technique. Subsequently, using the resist pattern 44 as a mask, the insulating film 16 is etched back by, for example, RIE (Reactive Ion Etching). As a result, an insulating sidewall spacer 25 is formed on a side surface of the gate electrode 23 on the drain side, and insulating sidewall spacers 35 are formed on both side surfaces of the gate electrode 33 as shown in FIG. 5A. The insulating film 16 covering the photodiode formation region R1 remains below the resist pattern 44.

Figure 5B:
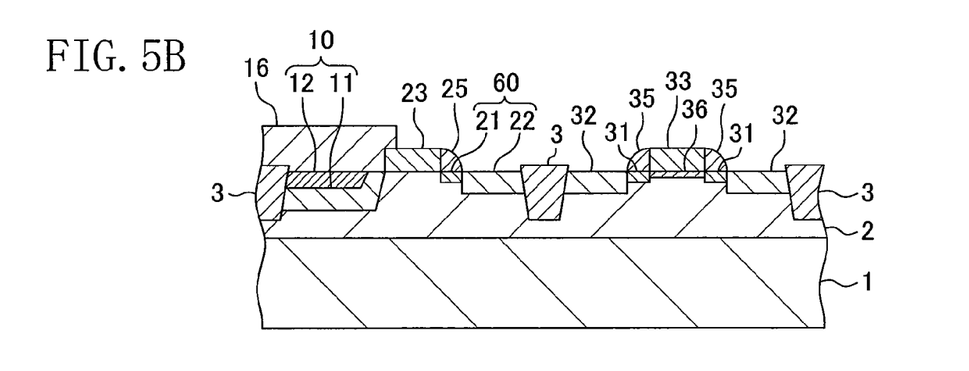

Then, the resist pattern 44 is removed by ashing or other like technique. N-type impurities, e.g., phosphorus (P), are implanted into the surface portion of the semiconductor substrate 1 by ion implantation using the gate electrode 23 and the insulating sidewall spacer 25 of the transfer transistor 20, the gate electrode 33 and the insulating sidewall spacers 35 of the amplifying transistor 30, and the remaining insulating film 16 as a mask to form an N-type high concentration impurity region 22 constituting part of the drain region of the transfer transistor 20 (the floating diffusion layer 60), and N-type high concentration impurity regions 32 constituting parts of the source and drain regions of the amplifying transistor 30 as shown in FIG. 5B. The phosphorus is implanted by ion implantation at an implantation energy of 10 keV and a dose amount of $1\times10^{15}$/cm$^2$. As a result, high concentration impurity regions 22 and 23 having a junction depth of about 200 nm and a maximum impurity concentration of about $1\times10^{20}$/cm$^3$ are formed. After the phosphorus ion implantation, activation annealing is performed, for example, at 850° C. for about 10 minutes.

Figure 5C:
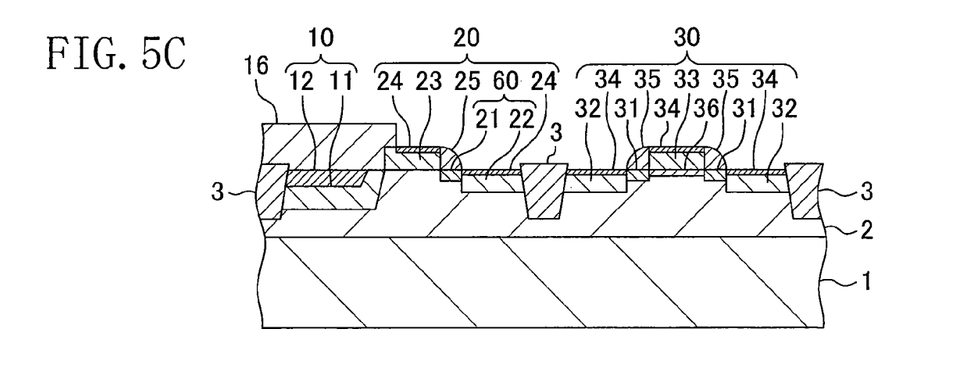

Then, a refractory metal film made of cobalt, for example, is deposited on the whole surface of the semiconductor substrate 1, and then lamp annealing is performed. As a result, as shown in FIG. 5C, metal silicide layers are formed in the surface portions of the silicon substrate and the polysilicon film (the gate electrodes) which are in direct contact with the refractory metal film. In the present embodiment, metal silicide layers 24 made of cobalt silicide are formed in the surface portions of the high concentration impurity region 22 and the gate electrode 23 of the transfer transistor 20. Likewise, metal silicide layers 34 made of cobalt silicide are formed in the surface portions of the high concentration impurity regions 32 and the gate electrode 33 of the amplifying transistor 30. The metal silicide layers 24 and 34 are formed by two-step annealing. Specifically, first annealing is performed at 440° C. for 66 seconds, and then second annealing is performed at 750° C. for 36 seconds. Part of the refractory metal film unreacted with the silicon substrate and the polysilicon film is selectively removed by wet etching or other like technique after the first annealing.

Subsequently, an interlayer insulating film is deposited on the whole surface of the semiconductor substrate 1. Then, contact holes reaching the metal silicide layers 24 and 34 are formed in the interlayer insulating film. Further, upper wires are formed in the contact holes and on the interlayer insulating film. Thus, the MOS solid state imaging device is completed.

In the present embodiment described above, ion implantation is performed to implant arsenic ions, for example, into the surface portion of the substrate serving as a channel region of the amplifying transistor 30, so that the low concentration impurity region 36 having an impurity concentration lower than that of the P-well 2 is formed as the channel region of the amplifying transistor 30. Therefore, the threshold voltage of the amplifying transistor 30 can be effectively reduced, and the number of carriers can be increased. This makes it possible to reduce the influence of the carrier trap that exists at the interface with the gate insulating film, and therefore the RTS noise characteristic can be improved.

Figure 6:
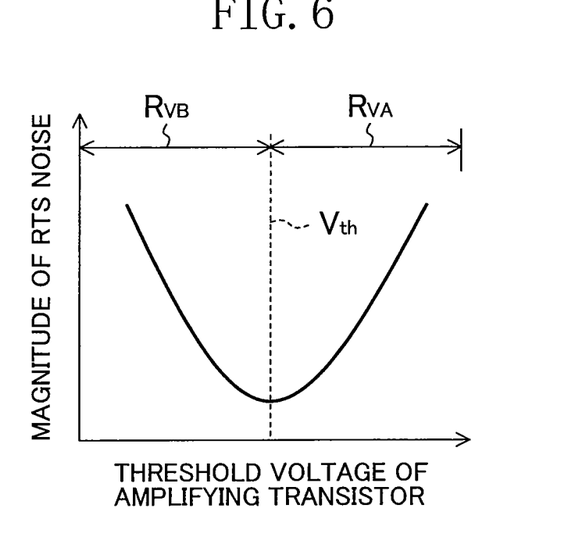
FIG. 6 is a graph illustrating the relationship between a threshold voltage of the amplifying transistor and the magnitude of RTS noise, which is a finding of the present inventor.

As described above, when the impurity concentration in the surface portion of the substrate serving as the channel region of the amplifying transistor 30 is substantially reduced, the threshold voltage is reduced. Therefore, the number of carriers is increased, and the RTS noise is reduced. In connection to this, as shown in FIG. 6, the present inventor has found that there is a local minimum value of the RTS noise in the plot of the relationship between the threshold voltage of the amplifying transistor 30 and the magnitude of the RTS noise. Referring to the graph of FIG. 6, a region where the RTS noise is reduced as the threshold voltage is reduced is indicated as $R_{VA}$. However, when an arsenic concentration in the surface portion of the substrate serving as the channel region is increased and the conductivity type varies to N, the RTS noise gradually increases. This region is indicated as $R_{VB}$ in FIG. 6. This is because the charge amount at the interface with the gate insulating film (oxide film) is increased when the conductivity type of the channel region varies from P to N. Then, the mobility of the charges at the interface is reduced, and the RTS noise is gradually increased. Therefore, the RTS noise is minimized at a threshold voltage $V_{th}$ where the substantial impurity concentration in the surface portion of the substrate serving as the channel region of the amplifying transistor 30 is the lowest (in other words, where the low concentration impurity region 36 is a substantially intrinsic semiconductor region). Specifically, in the present embodiment, the RTS noise is minimized at a threshold voltage of −0.3 V where the impurity concentration in the low concentration impurity region 36 is set to about $3 \times 10^{16}$ cm$^3$ or lower. At this time, the RTS noise is effectively reduced by about 4 dB as compared with the conventional amplifying transistor whose channel region is formed of a high concentration P-well only.

Figure 7:
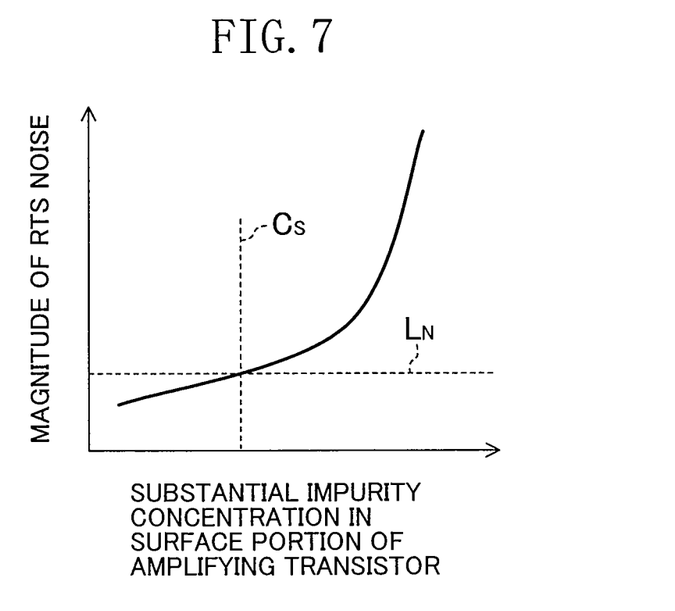
FIG. 7 is a graph illustrating the relationship between substantial impurity concentration in a surface portion of a substrate serving as a channel region of the amplifying transistor and the magnitude of the RTS noise, which is a finding of the present inventor.

As described above, in order to effectively reduce the RTS noise, it is necessary to reduce the substantial impurity concentration in the surface portion of the substrate serving as the channel region of the amplifying transistor to be lower than the impurity concentration in the well region. Specifically, as shown in FIG. 7, the impurity concentration is preferably set to be not higher than $C_s$ which is a concentration at which the RTS noise comes to the level $L_N$, which is a level at which the S/N characteristic of the circuit does not deteriorate. According to the present embodiment, it has been found that the deterioration of the S/N characteristic of the circuit can be prevented by forming the low concentration impurity region 36 having an impurity concentration of about $1 \times 10^{17}$ cm$^3$ or lower, which is half the impurity concentration of the P-well 2 (about $2 \times 10^{17}$ cm$^3$), in a region ranging from the substrate surface (the interface with the gate insulating film) to a depth of 60 nm.

As described above, in the present embodiment, N-type impurities are implanted into the surface portion of the substrate (the surface portion of the P-well 2) serving as the channel region of the amplifying transistor 30 at a relatively low concentration so as to form the low concentration impurity regions 36 having an impurity concentration substantially lower than that of the P-well 2. As a result, the number of carriers of the amplifying transistor 30 can be increased, and the occurrence of the RTS noise can be suppressed. This allows manufacture of high sensitive solid state imaging device with high yield.

It should be noted that the present disclosure is not limited to the above embodiment and various modifications and applications are possible within the spirit and essential features of the present disclosure. A feature of the present disclosure lies in reducing the impurity concentration in the surface portion of the substrate serving as the channel region of the amplifying transistor within such a range that does not reduce the charge mobility due to the increase in interface charge amount, thereby reducing the threshold voltage of the amplifying transistor. Therefore, within the extent of the technical concept, the aforementioned processes can be replaced with other equivalent processes. The process sequence may be changed, and a different material seed can be used. For example, in the present embodiment, the low concentration impurity regions 36 are formed after the P-well 2 is formed. Instead of this, the low concentration impurity regions 36 may be formed first, and then the P-well 2 may be formed. Further, in the present embodiment, the N-type impurity region 11 constituting the photodiode 10 is formed before the gate electrodes 23 and 33 are formed, more specifically, before the formation of the low concentration impurity regions 36 and after the formation of the P-well 2. This sequence may be changed so that the N-type impurity region 11 is formed after the formation of the gate electrodes 23 and 33 using a resist pattern having an opening corresponding to the photodiode formation region R1 only. Alternatively, the P-well 2 may be formed after the N-type impurity region 11 is formed. Further, the low concentration impurity regions 36 may be formed by ion implantation using phosphorus (P) instead of the ion implantation using arsenic (As) performed in the present embodiment.

The present disclosure is particularly suitable for the manufacture of the MOS solid state imaging devices, but is also applicable to various kinds of solid state imaging devices including a floating diffusion layer and an amplifying transistor connected to the floating diffusion layer through a gate electrode thereof. More specifically, high sensitive solid state imaging devices can be realized by applying the channel structure of the amplifying transistor of the present embodiment to the channel structure of the amplifying transistor of the various kinds of solid state imaging devices.

What is claimed is:

1. A solid state imaging device comprising:
a transfer transistor for transferring signal charges generated by photoelectric conversion to a floating diffusion layer;
a reset transistor for resetting a potential of the floating diffusion layer; and
an amplifying transistor for outputting a signal corresponding to the potential of the floating diffusion layer, wherein
the solid state imaging device includes
a first conductivity type semiconductor region serving as a well region of the amplifying transistor, and
a low concentration impurity region which is formed in part of a surface portion of the first conductivity type semiconductor region below a gate electrode of the amplifying transistor, and has an impurity concentration lower than that of the first conductivity type semiconductor region.

2. The solid state imaging device of claim 1, wherein the low concentration impurity region is substantially an intrinsic semiconductor region.

3. The solid state imaging device of claim 1, wherein the low concentration impurity region has an impurity concentration of $3 \times 10^{16}$ cm$^3$ or lower.

4. The solid state imaging device of claim 1, wherein, the low concentration impurity region has an impurity concentration of ½ or lower of the impurity concentration of the first conductivity type semiconductor region.

5. The solid state imaging device of claim 1, wherein, the low concentration impurity region is formed in a region ranging from an interface with a gate insulating film of the amplifying transistor to a depth of 60 nm.

6. The solid state imaging device of claim 1, wherein, an STI is formed in part of the first conductivity type semiconductor region between the transfer transistor and the amplifying transistor.

7. A method for manufacturing a solid state imaging device including a transfer transistor for transferring signal charges generated by photoelectric conversion to a floating diffusion layer, a reset transistor for resetting a potential of the floating diffusion layer, and an amplifying transistor for outputting a signal corresponding to the potential of the floating diffusion layer, the method comprising:
(a) forming a first conductivity type semiconductor region serving as a well region of the amplifying transistor on a substrate; and
(b) implanting a second conductivity type impurity to a surface portion of the first conductivity type semiconductor region to form a low concentration impurity region having an impurity concentration lower than that of the first conductivity type semiconductor region and serving as a channel region of the amplifying transistor.

8. The method for manufacturing a solid state imaging device of claim 7, wherein
the implantation (b) is performed before the formation (a).

9. The method for manufacturing a solid state imaging device of claim 7, wherein
the low concentration impurity region is substantially an intrinsic semiconductor region.

10. The method for manufacturing a solid state imaging device of claim 7, wherein
the second conductivity type impurity is arsenic or phosphorus.

* * * * *